United States Patent
Jeon et al.

(10) Patent No.: US 8,866,142 B2
(45) Date of Patent: Oct. 21, 2014

(54) DISPLAY DEVICE AND MANUFACTURING METHOD THEREOF

(75) Inventors: Sang-Jin Jeon, Suwon-si (KR); Gwang-Bum Ko, Asan-si (KR)

(73) Assignee: Samsung Display Co., Ltd., Yongin (KR)

( * ) Notice: Subject to any disclaimer, the term of this patent is extended or adjusted under 35 U.S.C. 154(b) by 105 days.

(21) Appl. No.: 13/177,259

(22) Filed: Jul. 6, 2011

(65) Prior Publication Data

US 2012/0199834 A1 Aug. 9, 2012

(30) Foreign Application Priority Data

Feb. 9, 2011 (KR) ........................ 10-2011-0011525

(51) Int. Cl.
*H01L 33/08* (2010.01)
*H01L 27/12* (2006.01)

(52) U.S. Cl.
CPC .......... *H01L 27/1225* (2013.01); *H01L 27/124* (2013.01)
USPC ........................ 257/59; 257/E33.053; 438/34

(58) Field of Classification Search
USPC ........... 257/23, 227, 291, 292, 439, 443, 655, 257/E27.1, E27.125, E27.112, E29.117, 257/E29.145, E29.147, E29.151, E29.182, 257/E29.202, E29.273–E29.299, E29.314, 257/E29.32, E23.016
See application file for complete search history.

(56) References Cited

U.S. PATENT DOCUMENTS

| | | | |
|---|---|---|---|
| 5,580,796 A | 12/1996 | Takizawa et al. | |
| 5,943,593 A * | 8/1999 | Noguchi et al. | 438/487 |
| 6,762,802 B2 | 7/2004 | Ono et al. | |
| 6,784,965 B2 * | 8/2004 | Kim et al. | 349/141 |
| 2010/0006835 A1 * | 1/2010 | Yoon et al. | 257/43 |
| 2010/0140613 A1 * | 6/2010 | Kimura | 257/43 |

FOREIGN PATENT DOCUMENTS

| | | |
|---|---|---|
| JP | 05-142575 | 6/1993 |
| JP | 06-202153 | 7/1994 |
| JP | 2001-324725 | 11/2001 |
| JP | 2002-131782 | 5/2002 |
| JP | 2007-226210 | 9/2007 |
| JP | 2008-122923 | 5/2008 |
| JP | 2010-156963 | 7/2010 |
| KR | 10-0467993 | 1/2005 |
| KR | 1020060127645 | 12/2006 |
| KR | 1020080043969 | 5/2008 |
| KR | 1020090057689 | 6/2009 |
| KR | 1020090105561 | 10/2009 |
| KR | 10-0936871 | 1/2010 |
| KR | 1020100065110 | 6/2010 |

* cited by examiner

*Primary Examiner* — David Vu
*Assistant Examiner* — Jonathan Han
(74) *Attorney, Agent, or Firm* — H.C. Park & Associates, PLC

(57) ABSTRACT

The present invention relates to a display device and a manufacturing method thereof. A display device according to an exemplary embodiment of the present invention includes a substrate including a first surface and a second surface, a first line disposed on the first surface and made of a transparent metal oxide semiconductor, and a first semiconductor disposed on the first surface and made of the transparent metal oxide semiconductor.

20 Claims, 15 Drawing Sheets

DISPLAY DEVICE AND MANUFACTURING METHOD THEREOF

CROSS REFERENCE TO RELATED APPLICATION

This application claims priority from and the benefit of Korean Patent Application No. 10-2011-0011525, filed on Feb. 9, 2011, which is hereby incorporated by reference for all purposes as if fully set forth herein.

BACKGROUND OF THE INVENTION

1. Field of the Invention

Exemplary embodiments of the invention relate to a display device and a manufacturing method thereof.

2. Discussion of the Background

Flat panel display devices have become increasingly popular, and sales of flat panel display devices are growing quickly. A flat panel display device is a display device with a thin screen or display. Flat panel display devices include, but are not limited to, a liquid crystal display (LCD) and an organic light emitting device (OLED).

A display device may include a plurality of pixels and a plurality of signal lines. In a conventional display device, a signal line transmitting a common voltage to a pixel is generally opaque such that light may not be transmitted, thereby reducing the aperture ratio when light is passed through each pixel area.

SUMMARY OF THE INVENTION

Exemplary embodiments of the invention improve the aperture ratio of a display device.

Additional features of the exemplary embodiments will be set forth in the description which follows, and in part will be apparent from the description, or may be learned by practice of the invention.

Exemplary embodiments of the invention disclose a display device including a substrate, a first line, and a first semiconductor. The first line is disposed on the substrate. The first line includes a transparent metal oxide semiconductor. The first semiconductor, different than the first line, is disposed on the first surface. The first semiconductor includes the transparent metal oxide semiconductor.

Exemplary embodiments of the invention disclose a manufacturing method of a display device. The method includes depositing and patterning an opaque conductive material on a first surface of a substrate to form a gate line including a gate electrode, depositing and patterning a transparent metal oxide semiconductor on the first surface to form a semiconductor wire and a first semiconductor, and irradiating radiation at a second surface of the substrate parallel to the first surface to form a first line such that the semiconductor wire is highly conductive.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
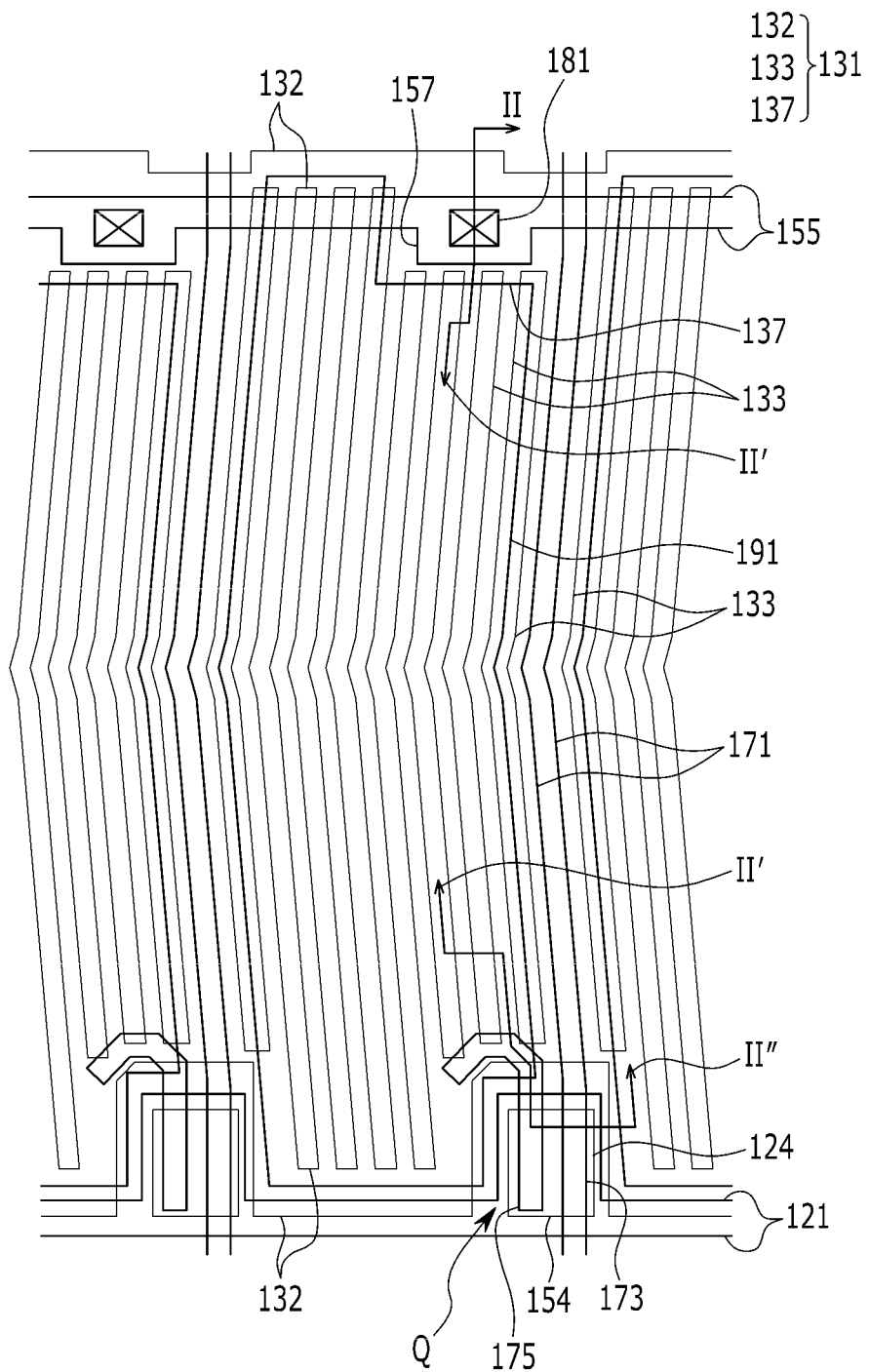
FIG. 1 is a layout view of one pixel of a display device according to exemplary embodiments of the present invention.

Exemplary embodiments of the invention are described more fully hereinafter with reference to the accompanying drawings, in which embodiments of the invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, exemplary embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described in detail with reference to the accompanying drawings.

Figure 2:
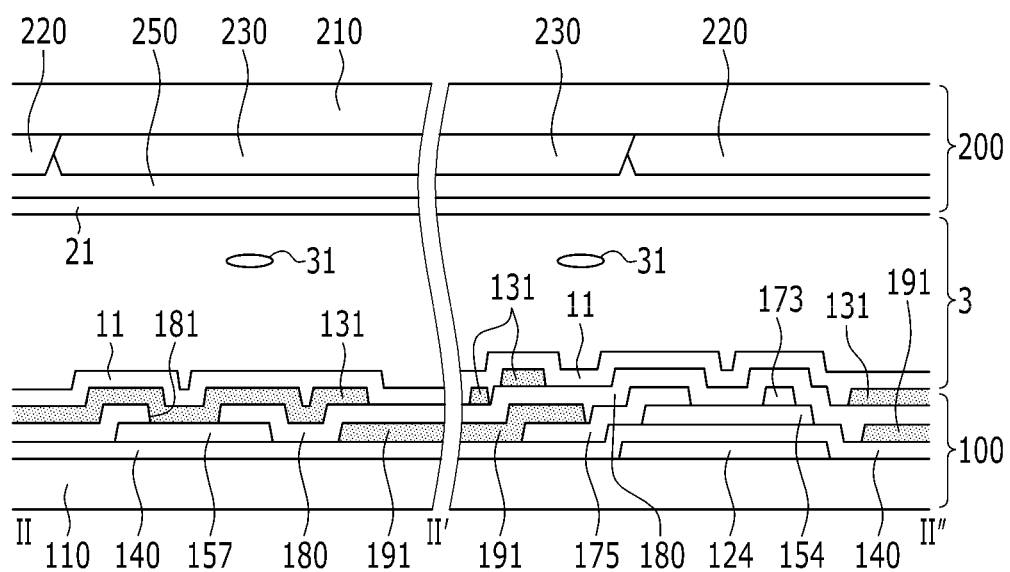
FIG. 2 is a cross-sectional view taken along lines II-II' and II'-II" of the display device of FIG. 1 according to exemplary embodiments of the present invention.

FIG. 1 is a layout view of a pixel of a display device according to exemplary embodiments of the present invention. FIG. 2 is a cross-sectional view taken along lines II-II' and II'-II" of the display device of FIG. 1.

The display device may be a liquid crystal display (LCD). As illustrated in FIG. 1 and FIG. 2, the LCD may include a lower panel 100, an upper panel 200 facing the lower panel 100, and a liquid crystal layer 3 interposed between the two display panels 100 and 200.

Referring to the upper panel 200, a light blocking member 220 and color filters 230 may be formed on an insulating substrate 210. The light blocking member 220 may define an opening area through which light may be transmitted. The color filers 230 may be provided in the opening area and/or within an area surrounded by the light blocking member 220. Each color filter 230 may be a filter of a primary color, such as red, green, and blue. An overcoat 250 may be further formed on the light blocking member 220 and the color filters 230.

In some cases, at least one of the light blocking members 220 and the color filter 230 may be disposed in the lower panel 100.

The liquid crystal layer 3 interposed between the lower panel 100 and the upper panel 200 may include liquid crystal molecules 31, and in a state in which no electric field is applied, the liquid crystal molecules 31 may be aligned so that the long axis thereof is parallel to the surfaces of the two panels 100 and 200. The alignment of the liquid crystal molecules 31 may change after application of an electric field between panels 100 and 200. For example, in some cases, when an electric field is applied, the liquid crystal molecules 31 may be aligned so that the long axis thereof is perpendicular to the surfaces of the two panels 100 and 200.

Alignment layers 11 and 21 may be horizontal alignment layers and may be coated on respective inner surfaces of the two display panels 100 and 200.

Hereinafter, the lower panel 100 will be described.

A plurality of gate lines 121 may be formed on an insulation substrate 110. Each gate line 121 may transmit a gate signal and may extend in a transverse direction. Each gate line 121 may include a plurality of gate electrodes 124 protruding upward (e.g., vertically away from the insulation substrate 110). The gate lines 121 including the gate electrodes 124 may be made of an opaque metal or, in general, of any suitable material. For example, the gate lines 121 may be made of an aluminum-containing metal such as aluminum (Al) or an aluminum alloy, a silver-containing metal such as silver (Ag) or a silver alloy, a copper-containing metal such as copper (Cu) or a copper alloy, a molybdenum-containing metal such as molybdenum (Mo) or a molybdenum alloy, chromium (Cr), thallium (Ta), and titanium (Ti).

A gate insulating layer 140 may be formed on the gate line 121. The gate insulating layer 140 may be made of an inorganic insulator such as silicon nitride (SiNx) or silicon oxide (SiOx). In general, the gate insulating layer 140 may be made of any suitable material and is not limited to an inorganic insulator. For example, in some cases, the gate insulating layer 140 may be made of an organic insulator.

A plurality of common voltage lines 155 and a plurality of semiconductor islands 154 may be formed on the gate insulating layer 140.

The common voltage lines 155 may carry a predetermined voltage, such as a common voltage Vcom, and may extend in the transverse direction substantially parallel to the gate lines 121. Each common voltage line 155 may include a plurality of expansions 157.

Each semiconductor island 154 may be disposed on a gate electrode 124, and may be mostly covered by the gate line 121 and the gate electrode 124.

The common voltage line 155 and the semiconductor island 154 may be made of any suitable material including, but not limited to, a transparent (metal) oxide semiconductor. The oxide semiconductor may have a large band gap and high carrier mobility such that it is transparent in a visible ray region. The oxide semiconductor may have a greater electron mobility than amorphous silicon. An example of the oxide semiconductor may be, for example, indium-gallium-zinc-oxide (IGZO) having a band gap of about 3.37 eV. The oxide semiconductor may have high conductivity if it receives radiation/light of a high frequency (e.g., ultraviolet rays). The common voltage line 155 may have high conductivity since the oxide semiconductor may be deposited, patterned, and then irradiated such that the electron mobility is high thereby providing the high conductivity in a manufacturing process.

The common voltage line 155 and the semiconductor island 154 may be formed using the same layer, or, in some cases, using different layers.

A plurality of data lines 171 and a plurality of drain electrodes 175 may be formed on the common voltage line 155, the semiconductor island 154, and the gate insulating layer 140.

The data lines 171 may carry a data signal and may intersect the gate lines 121 and the common voltage lines 155. Each data line 171 mainly extends in a longitudinal direction, and may be curved at least once at the center portion of each pixel area, thereby forming an oblique angle with respect to the longitudinal direction. The data lines 171 include a plurality of source electrodes 173 overlapping the gate electrodes 124.

Each drain electrode 175 may include one end facing the source electrode 173 with respect to the gate electrode 124.

The gate electrode 124, the source electrode 173, the semiconductor island 154, and the drain electrode 175 may form a thin film transistor (TFT) Q, which may function as a switching element. The channel of the thin film transistor Q is formed in the semiconductor island 154 between the source electrode 173 and the drain electrode 175.

A pixel electrode 191 may be formed on the data line 171 and the drain electrode 175. The pixel electrode 191 may be disposed directly on the drain electrode 175 of the thin film transistor Q and may directly contact a portion of the drain electrode 175, and any remaining portion of the pixel electrode 191 may contact the gate insulating layer 140. The pixel electrode 191 may receive data voltage from the drain electrode 175. The pixel electrode 191 may be made of any suitable material, including but not limited to, a transparent conductive material such as Indium Tin Oxide (ITO) or Indium Zinc Oxide (IZO).

In some cases, an insulating layer (not shown) may be formed between the drain electrode 175 and the pixel electrode 191. This insulating layer may have a contact hole (not shown) exposing the drain electrode 175, and the pixel electrode 191 may be electrically connected to the drain electrode 175 through the contact hole.

The pixel electrode 191 may fill most of the region (hereafter referred to as "a pixel area") enclosed by the gate line 121 and the data line 171. The pixel electrode 191 may have sides that are substantially parallel to the gate line 121 and the data line 171. In some cases, a corner of a portion of the pixel electrode 191 at which the thin film transistor Q or the expansion 157 of the common voltage line 155 is disposed may be chamfered, but the shape thereof is not limited thereto.

A passivation layer 180 may be formed on the pixel electrode 191. The passivation layer 180 may be made of any suitable material including, but not limited to, an inorganic insulator or an organic insulator. The passivation layer 180 may have a plurality of contact holes 181 exposing a portion of the common voltage line 155, for example, a portion of the expansion 157. The contact hole 181 may be disposed for at least two pixel areas.

A common electrode 131 may be formed on the passivation layer 180, and may be made of various suitable materials including, for example, a transparent conductive material such as ITO or IZO. The common electrode 131 disposed at one pixel area may include a pair of transverse outer stems 132 facing each other and a plurality of branch electrodes 133 connecting the pair of transverse outer stems 132.

The transverse outer stems 132 may extend in the transverse direction and may be parallel to the gate line 121. The transverse outer stems 132 may include a plurality of expansions 137. An expansion 137 may be disposed at least at every two pixel areas, and may receive a predetermined voltage such as the common voltage Vcom from the common voltage line 155 through the contact hole 181. The transverse outer stems 132 may be removed at a portion where the thin film transistor Q is disposed.

The plurality of branch electrodes 133 may be substantially parallel to each other and may extend parallel to the data lines 171. The branch electrodes 133 may be inclined at an oblique angle with respect to the longitudinal direction (e.g., parallel to the data lines 171), and the inclined direction may be different at the upper side and the lower side with respect to an imaginary transverse center line of the pixel area. A width of the branch electrodes 133 extending according to the data lines 171 and overlapping the data lines 171 may be larger than a width of the branch electrodes 133 not overlapping the data lines 171. The branch electrodes 133 may mostly be disposed inside the pixel area.

When the pixel electrode 191 receives data voltage through the thin film transistor Q and the common voltage Vcom from the common voltage line 155 is applied to the common electrode 131, the pixel electrode 191 and the common electrode 131 may generate an electric field in the liquid crystal layer 3 to determine the orientation of the liquid crystal molecules 31 of the liquid crystal layer 3 and to display an image.

In some cases, the common voltage line 155 and the semiconductor island 154 may be formed of transparent oxide semiconductor such as Indium Gallium Zinc Oxide (IGZO) such that the aperture ratio of the display device may be increased. Another opaque metal layer may not be disposed on the common voltage line 155. The oxide semiconductor forming the common voltage line 155 may have high conductivity through continuous irradiation of high energy radiation/light such that uniform potential of the common voltage may be maintained for the entire lower panel 100, thereby reducing display deterioration such as flicker.

According to exemplary embodiments, the common electrode 131 may be disposed over the pixel electrode 191, and the common electrode 131 may have a plurality of branch electrodes 133. In contrast, a pixel electrode may have a plurality of branch electrodes disposed on a common electrode. In this case, the common electrode having a shape of plane may receive the common voltage from the common voltage line 155 and the pixel electrode may receive data voltage from the thin film transistor Q to form the electric field in the liquid crystal layer 3.

Next, a method for manufacturing a lower panel 100 of a liquid crystal display according to exemplary embodiments of the present invention will be described with reference to FIG. 3, FIG. 4, FIG. 5, FIG. 6, FIG. 7, FIG. 8, FIG. 9, FIG. 10, and FIG. 11.

FIG. 3, FIG. 5, FIG. 8, and FIG. 10 are layout views sequentially showing intermediate steps of a manufacturing method of the display device shown in FIG. 1 and FIG. 2 according to exemplary embodiments of the present invention.

Figure 3:
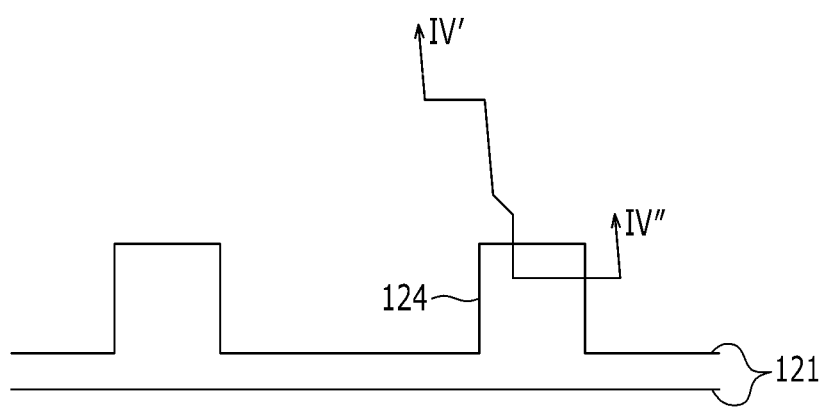
FIG. 3, FIG. 5, FIG. 8, and FIG. 10 are layout views showing intermediate steps of a manufacturing method of the display device shown in FIG. 1 according to exemplary embodiments of the present invention.
Figure 4:
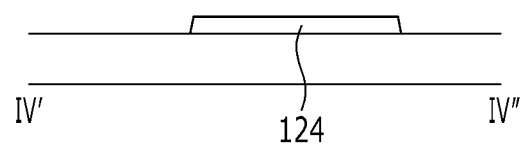
FIG. 4 is a cross-sectional view taken along lines IV-IV' and IV'-IV" of the display device of FIG. 3 according to exemplary embodiments of the present invention.

Referring to FIG. 3 and FIG. 4, an opaque metal such as aluminum may be deposited and patterned on an insulation substrate 110 made of transparent glass to form a plurality of gate lines 121 including gate electrodes 124.

Figure 5:
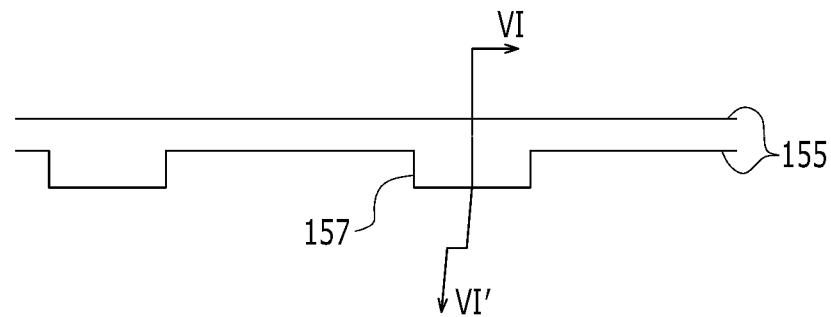
Figure 5:
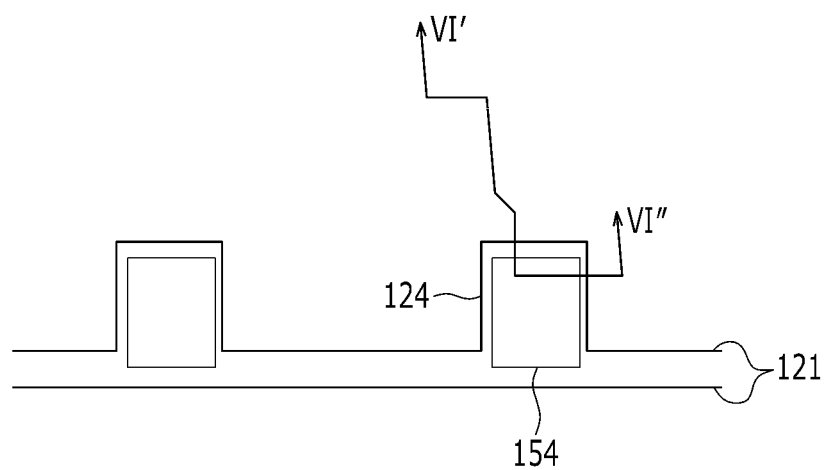
Figure 6:
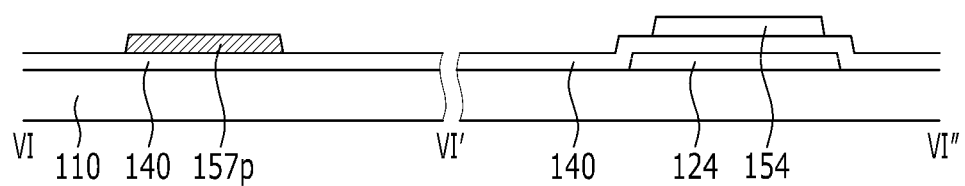
FIG. 6 is a cross-sectional view taken along lines VI-VI' and VI'-VI" of the display device of FIG. 5 according to exemplary embodiments of the present invention.
Figure 7:
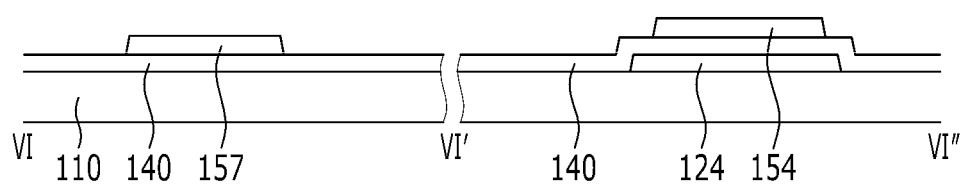
FIG. 7 shows light irradiation on the cross-sectional view illustrated in FIG. 6 according to exemplary embodiments of the present invention.
Figure 7:
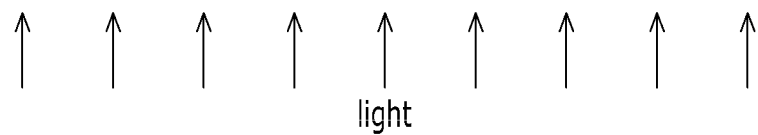

Next, referring to FIG. 5, FIG. 6, and FIG. 7, a gate insulating layer 140 may be formed on the gate line 121 and the gate electrode 124.

A transparent metal oxide semiconductor layer, such as IGZO, may be deposited and patterned to form a plurality of semiconductor wire (not shown) having expansions 157p and a plurality of semiconductor islands 154.

Next, as shown in FIG. 7, radiation/light, such as ultraviolet rays, may be irradiated at a rear side of the substrate 110 on which the insulating layer 140 and semiconductor layers 154, 157p are not formed such that the semiconductor wire including the expansions 157p are exposed to the radiation/light. The semiconductor wire, including expansions 157p, may be completely exposed to the radiation/light, thereby generating a photocurrent and having high conductivity to form the common voltage line 155 including expansions 157. The opaque gate electrode 124 blocks radiation/light irradiated at the rear surface of the substrate 110 such that the semiconductor island 154 may maintain its semiconductor characteristics. The channel region of the thin film transistor Q is also covered by the gate line 121 as well as the gate electrode 124 such that the channel region maintains its semiconductor characteristics.

Figure 8:
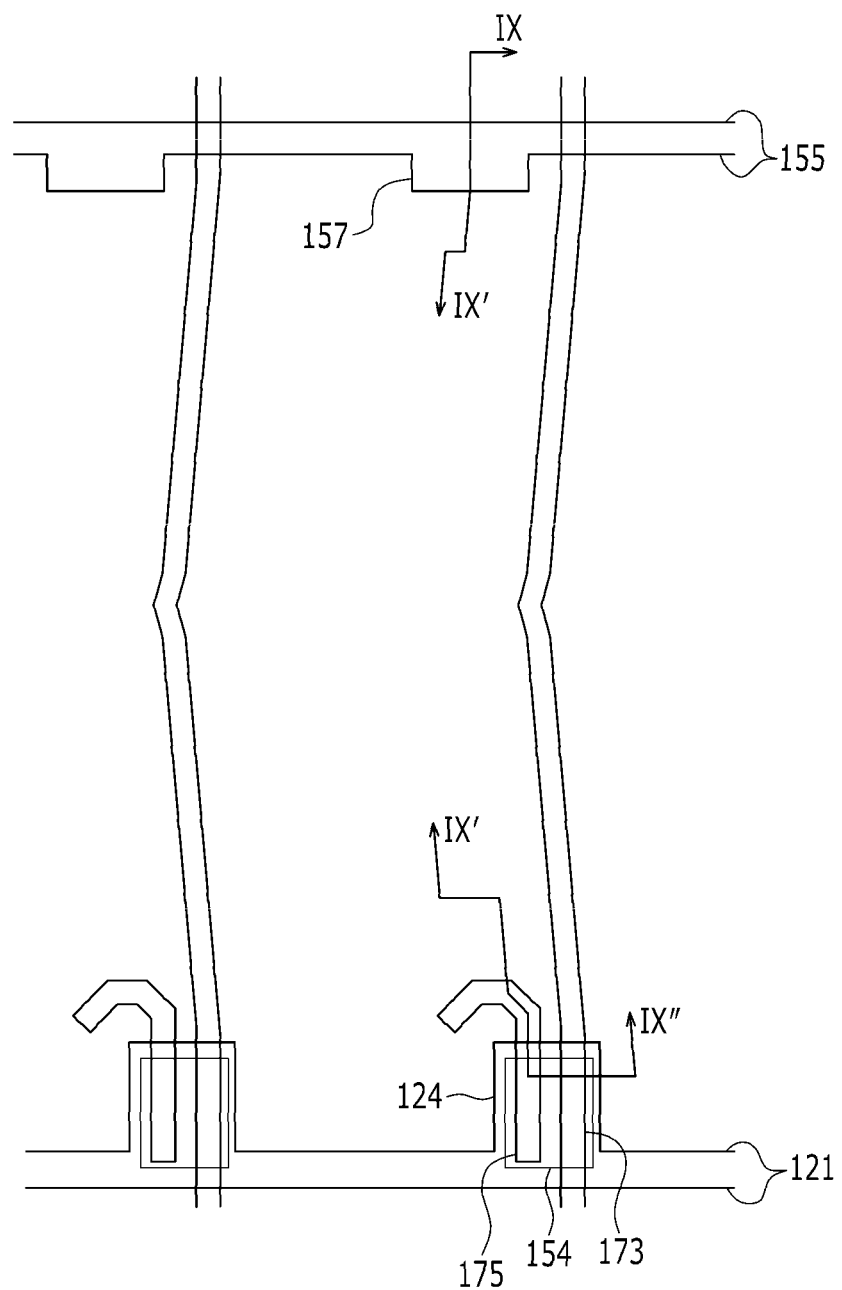
Figure 9:
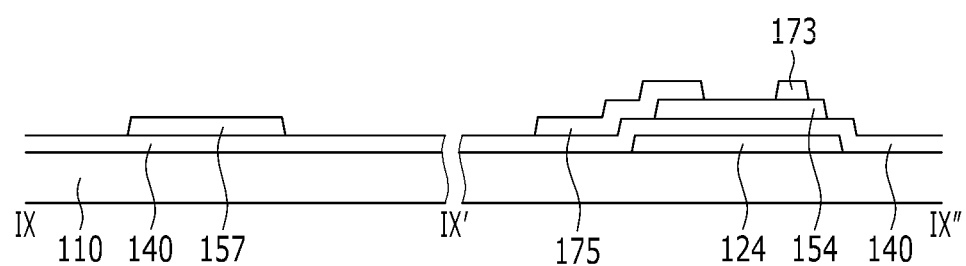
FIG. 9 is a cross-sectional view taken along lines IX-IX' and IX'-IX" of the display device of FIG. 8 according to exemplary embodiments of the present invention.

Referring to FIG. 8 and FIG. 9, a conductive material is deposited and patterned on the common voltage line 155 and the semiconductor island 154 to form a plurality of data lines 171 including a plurality of source electrodes 173 and a plurality of drain electrodes 175.

Figure 10:
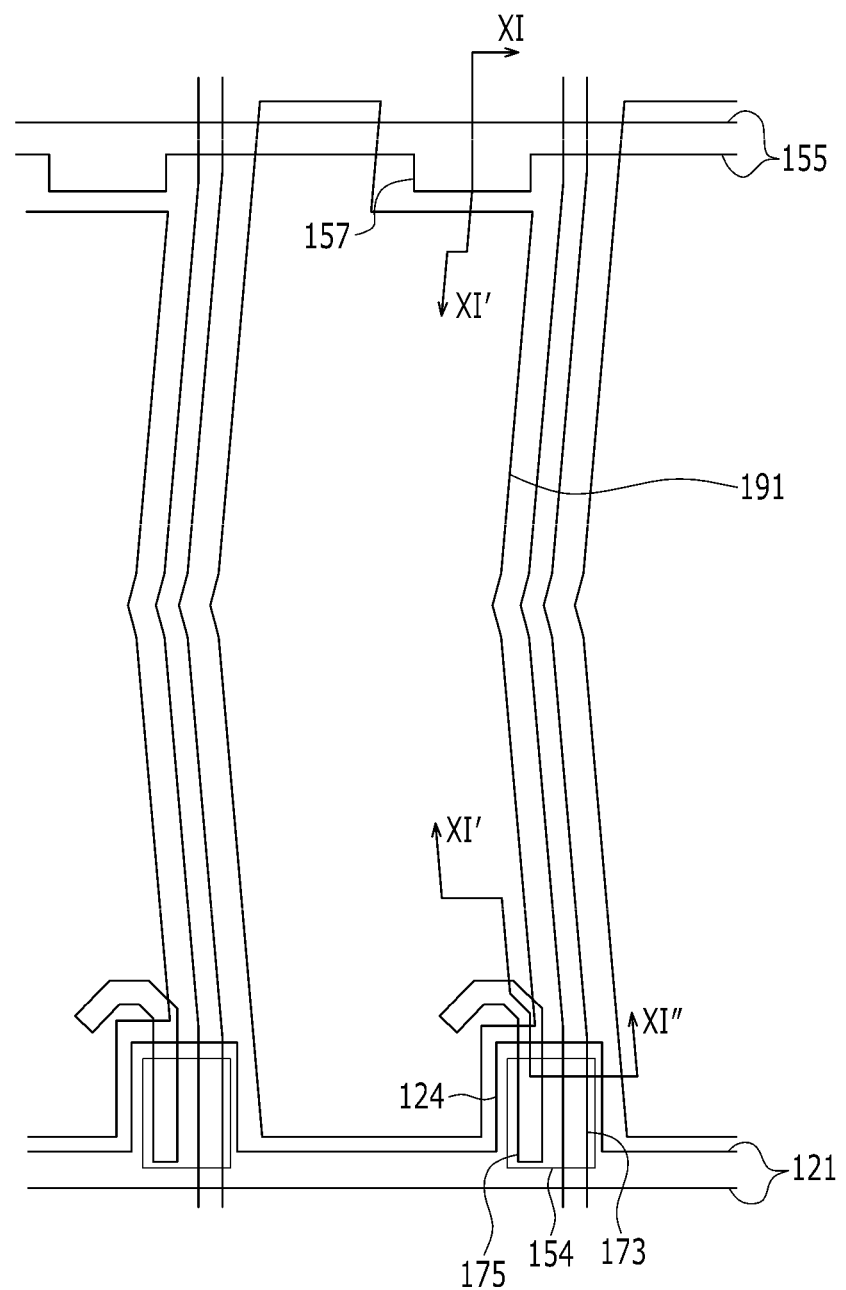
Figure 11:
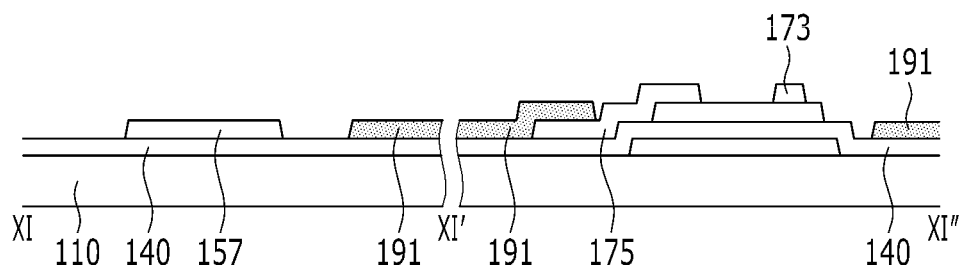
FIG. 11 is a cross-sectional view taken along lines XI-XI' and XI'-XI" of the display device of FIG. 10 according to exemplary embodiments of the present invention.

Next, referring to FIG. 10 and FIG. 11, a transparent conductive material, such as ITO or IZO, may be deposited and patterned on the data line 171 and the drain electrode 175 to form a plurality of pixel electrodes 191 directly contacting the drain electrodes 175.

Referring to FIG. 1 and FIG. 2, a passivation layer 180 having a contact hole 181 may be formed on the pixel electrodes 191. Next, a transparent conductive material such as ITO or IZO may be deposited and patterned to form a common electrode 131 including a plurality of branch electrodes 133. An alignment layer 11 may be formed on the passivation layer 180, the common electrode 131, and the branch electrodes.

As described above, radiation/light is irradiated at the rear side of the substrate 110 after the deposition and the patterning of the oxide semiconductor to form the common voltage line 155 with high conductivity.

Next, a display device according to other exemplary embodiments of the present invention will be described with reference to FIG. 12 and FIG. 13. The same components as in the above-described exemplary embodiments are denoted by the same reference numerals, and a detailed description thereof is omitted hereinafter.

Figure 12:
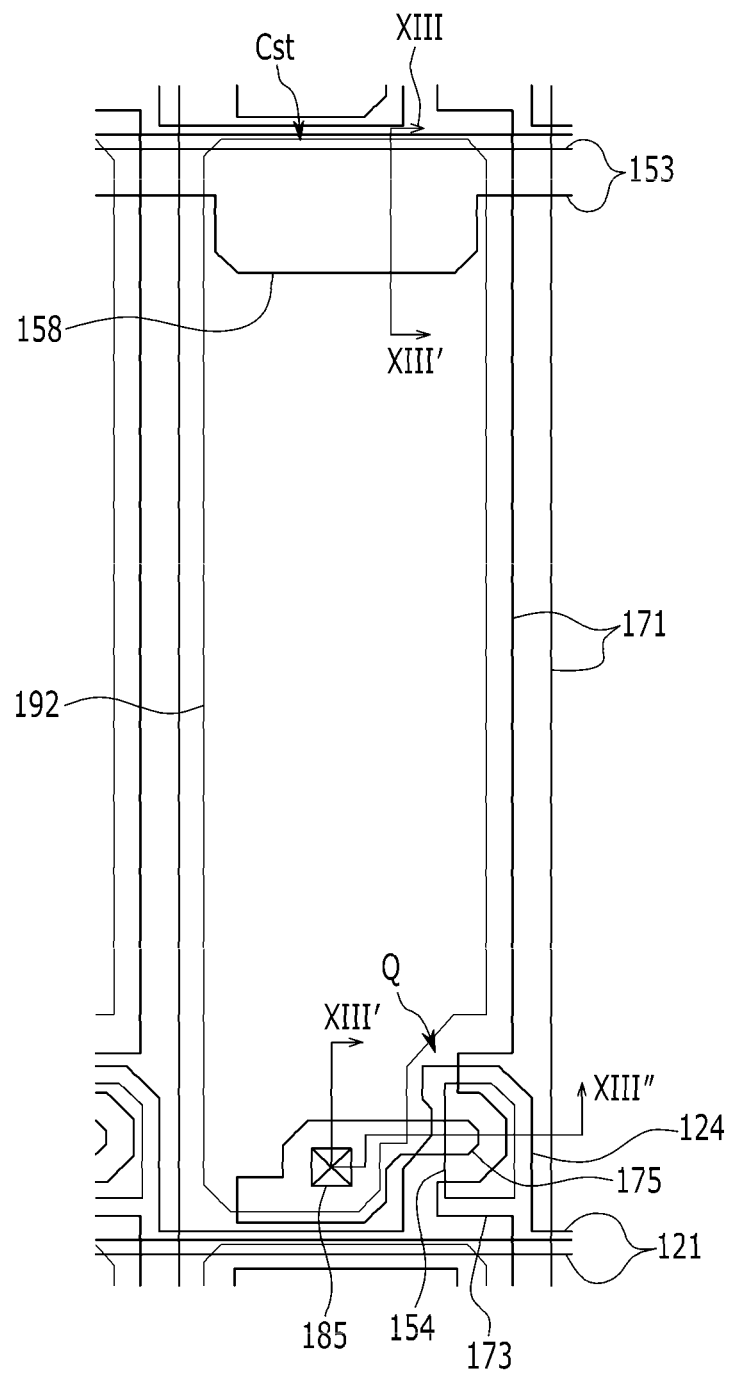
FIG. 12 is a layout view of one pixel of a display device according to exemplary embodiments of the present invention.

FIG. 12 is a layout view of a pixel of a display device according to exemplary embodiments of the present invention. FIG. 13 is a cross-sectional view taken along lines XIII-XIII' and XIII'-XIII" of the display device of FIG. 12.

Figure 13:
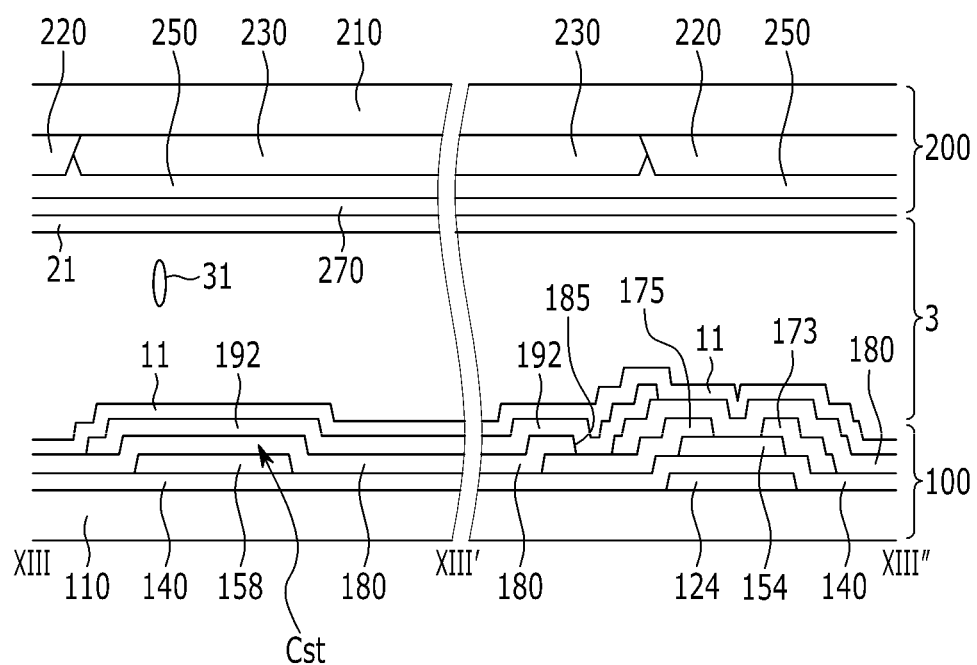
FIG. 13 is a cross-sectional view taken along lines XIII-XIII' and XIII'-XIII" of the display device of FIG. 12 according to exemplary embodiments of the present invention.

Referring to FIG. 12 and FIG. 13, the display device may be a LCD and may include a lower panel 100, an upper panel 200 facing the lower panel 100, and a liquid crystal layer 3 interposed between the two display panels 100 and 200.

The cross-sectional structure of the upper panel 200 is similar to that of the above-described exemplary embodiments illustrated from FIG. 1 to FIG. 11; however, in contrast to the above-described exemplary embodiments, a common electrode 270 may be formed on an overcoat 250. The common electrode 270 may be made of any suitable material including, but not limited to, a transparent conductor such as ITO and IZO.

Next, the lower panel 100 will be described.

A plurality of gate lines 121 having gate electrodes 124 that are opaque may be formed on the insulation substrate 110, and a gate insulating layer 140 may be formed on the gate lines 121, the gate electrodes 124, and the insulation substrate.

A plurality of storage electrode lines 153 and a plurality of semiconductor islands 154 may be formed on the gate insulating layer 140.

A predetermined voltage, such as the common voltage Vcom, may be applied to each storage electrode line 153. The storage electrode lines 153 extending in the transverse direction may be substantially parallel to the gate lines 121. Each storage electrode line 153 may be disposed between two neighboring gate lines 121 and may be formed close to the lower gate line 121. Each storage electrode line 153 may include a plurality of storage electrodes 158, which may protrude downward. However, it should be understood that the shapes and arrangement of the storage electrode lines 153 can be modified in various forms.

The semiconductor island 154 may be disposed on the gate electrode 124, and may be mostly covered by the gate line 121 as well as the gate electrode 124.

The storage electrode line 153 and the semiconductor island 154 may be made of any suitable material including, for example, a transparent metal oxide semiconductor. The storage electrode line 153 may have a high but different conductivity than the semiconductor island 154.

A plurality of data lines 171 and a plurality of drain electrodes 175 may be formed on the storage electrode line 153, the semiconductor island, 154 and the gate insulating layer 140. The data lines 171 may extend in a longitudinal direction and may intersect the gate lines 121 and the storage electrode line 153. The data lines 171 may include the source electrode 173, which may be curved toward the gate electrode 124.

A passivation layer 180 may be formed on the data line 171 and the drain electrode 175. The passivation layer 180 may have a plurality of contact holes 185 exposing a portion of the drain electrode 175. The passivation layer 180 may be made of any suitable material including, but not limited to, an inorganic insulator.

A pixel electrode 192 made of a transparent conductive material, such as ITO or IZO or a reflective metal such as aluminum, silver, chromium, or alloys thereof, can be formed on the passivation layer 180. The overall outer shape of one pixel electrode 192 may be rectangular, and the corner of a portion where the thin film transistor Q is disposed may be chamfered. It should, however, be understood that the pixel electrode 192 is not limited to a rectangular shape, and that the pixel electrode 192 may be any suitable shape.

The pixel electrode 192 may be physically and electrically connected to the drain electrode 175 through the contact hole 185 to receive data voltage from the drain electrode 175.

Alignment layers 11 and 21 may coat the inner surface of the lower panel 100 and the upper panel 200, respectively, and may be vertical or horizontal alignment layers.

The liquid crystal layer 3 between the lower panel 100 and the upper panel 200 may have a negative dielectric anisotropy, and may be oriented such that the major axes of the liquid crystal molecules of the liquid crystal layer 3 are perpendicular or parallel to the surfaces of the two display panels 100 and 200 when no electric field is applied.

An electric field may be formed in the liquid crystal layer 3 when data voltage is applied to the pixel electrode 192 and a common voltage Vcom is applied to the common electrode 270. When the electric field is formed, an image may be displayed by the display device.

The pixel electrode 192 of the lower panel 100 and the common electrode 270 of the upper panel 200 may form a liquid crystal capacitor Clc, and may maintain a charge after the thin film transistor Q is turned off. The pixel electrode 192 may overlap the storage electrode 158 of the storage electrode line 153 via the passivation layer 180 interposed therebetween, thereby forming a storage capacitor Cst. The storage capacitor Cst may enhance the voltage storage capacity of the liquid crystal capacitor Clc.

The storage electrode line 153 may be formed with the transparent oxide semiconductor, such as IGZO, along with the semiconductor island 154, thereby increasing the aperture ratio of the display device. Also, the storage electrode line 153 may have a high but different conductivity from the semiconductor island 154, such that the common voltage may be uniformly transmitted to the entire lower panel 100.

Figure 14:
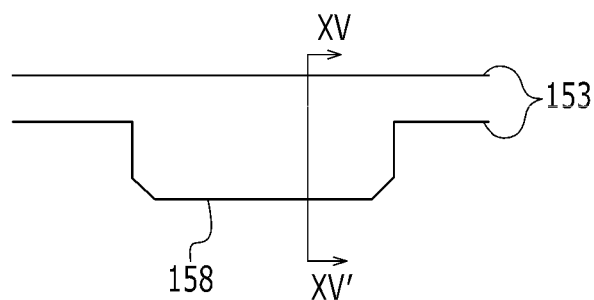
FIG. 14 is a layout view showing an intermediate step of a manufacturing method of the display device shown in FIG. 12 according to exemplary embodiments of the present invention.
Figure 14:
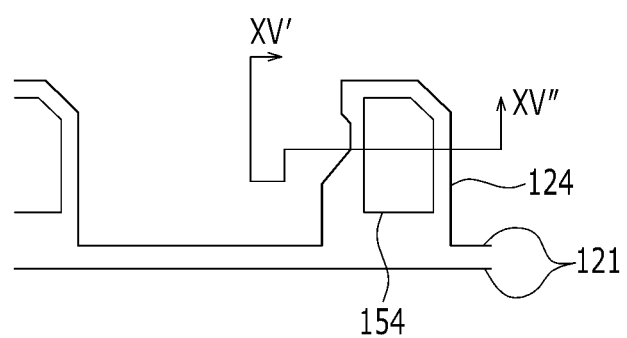
Figure 15:
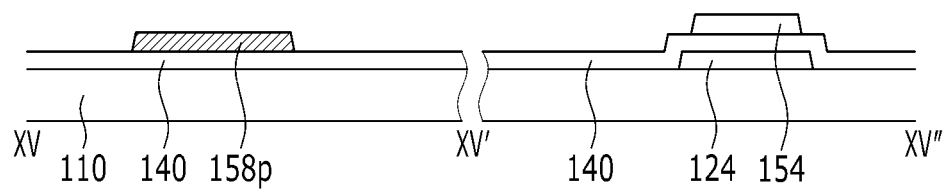
FIG. 15 is a cross-sectional view taken along lines XV-XV' and XV'-XV" of the display device of FIG. 14

Next, the method for manufacturing the lower panel 100 of the liquid crystal display according to exemplary embodiments of the present invention will be described with reference to FIG. 14, FIG. 15, and FIG. 16.

First, opaque metal, such as aluminum or silver, may be deposited and patterned on the insulation substrate 110 to form a plurality of gate lines 121 including the gate electrodes 124. The insulation substrate 110 may be made of various suitable materials, including, but not limited to, transparent glass.

Next, a gate insulating layer 140 may be deposited on the gate line 121, and a transparent metal oxide semiconductor layer, such as IGZO, may be deposited and patterned to form a plurality of semiconductor wires 158p and a plurality of semiconductor islands 154.

Figure 16:
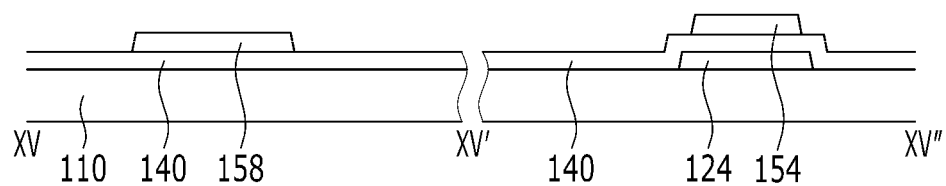
FIG. 16 shows light irradiation on the cross-sectional view illustrated in FIG. 15 according to exemplary embodiments of the present invention.
Figure 16:
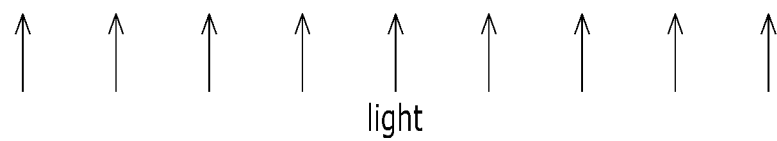

Next, as shown in FIG. 16, radiation/light, such as ultraviolet rays, may be irradiated at a rear side of the substrate 110 on which the insulating layer 140 and semiconductor layers 154, 158p are not formed, such that the plurality of semiconductor wires 158p is exposed to the radiation/light. The semiconductor wire 158p may be completely exposed to the light so that photocurrent is generated, thereby providing high conductivity to the storage electrode line 153 including a storage electrode 158. In such cases, the gate line 121 and the opaque gate electrode 124 may block the radiation/light irradiated at the rear surface of the substrate 110 so that the semiconductor island 154 retains its semiconductor characteristics.

Next, on the storage electrode line 153 and the semiconductor island 154, a plurality of data lines 171 and a plurality of drain electrodes 175 may be formed, and a passivation layer 180 having a contact hole 185 may be formed thereon. Next, the transparent conductive material comprising ITO, IZO, or a conductive metal may be deposited and patterned to form a pixel electrode 192.

According to exemplary embodiments, radiation/light may also be irradiated at the rear side of the substrate 110 to form the storage electrode line 153 having conductivity after the deposition and the patterning of the oxide semiconductor.

Next, a display device according to exemplary embodiments of the present invention will be described with reference to FIG. 17 and FIG. 18.

Figure 17:
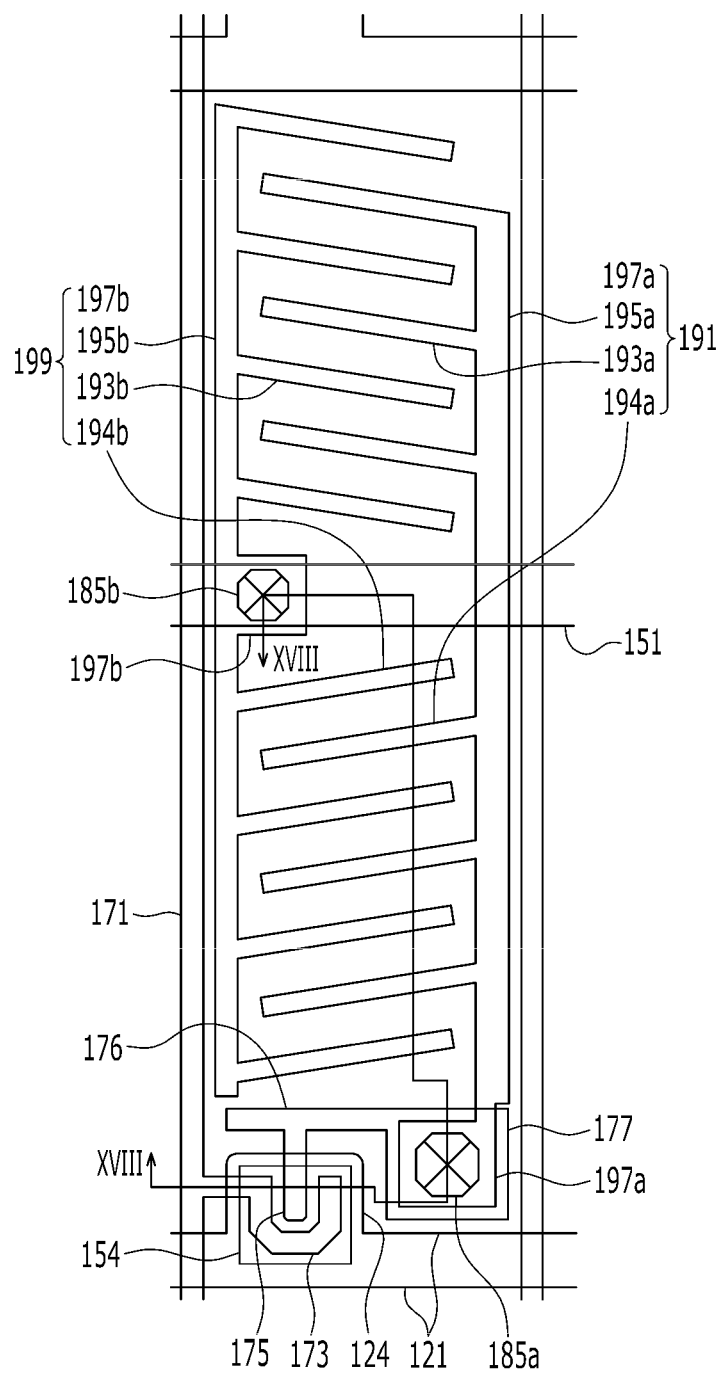
FIG. 17 is a layout view of a liquid crystal display according to exemplary embodiments of the present invention.
Figure 18:
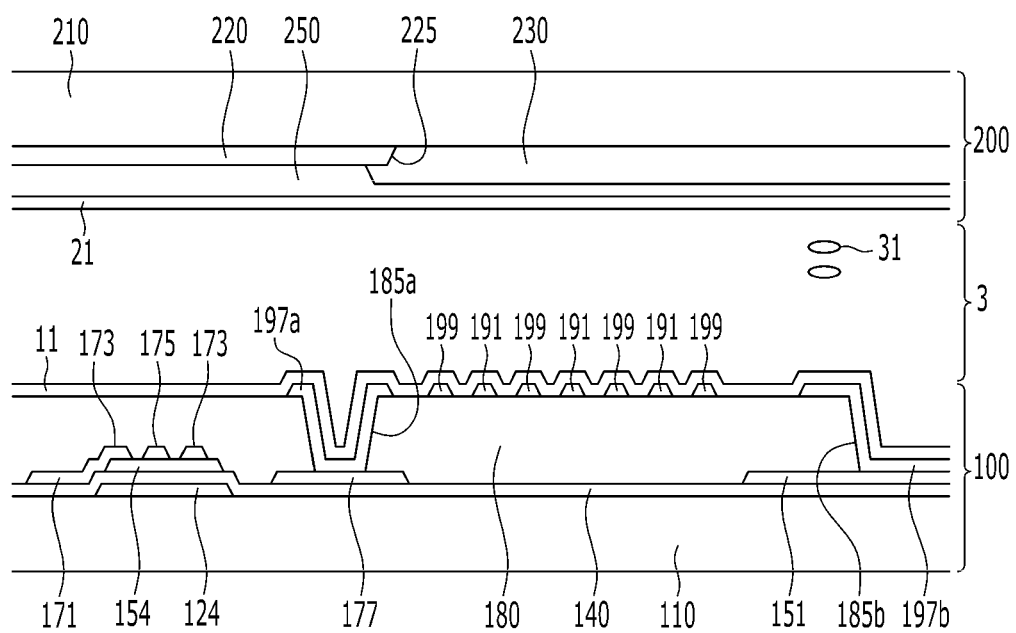
FIG. 18 is a cross-sectional view taken along line XVIII-XVIII of the liquid crystal display of FIG. 17 according to exemplary embodiments of the present invention.

FIG. 17 is a layout view of a liquid crystal display according to exemplary embodiments of the present invention, and FIG. 18 is a cross-sectional view taken along line XVIII-XVIII of the liquid crystal display of FIG. 17.

The layered structure of the LCD illustrated in FIG. 18 is the same as the layered structure of the LCD shown in FIG. 12 and FIG. 13.

Referring to the lower panel 100, a plurality of gate lines 121 including gate electrodes 124 may be formed on an insulation substrate 110. A gate insulating layer 140 may be formed on the gate lines 121, gate electrodes 124, and the insulation substrate 110.

A plurality of common voltage lines 151 and a plurality of semiconductor islands 154 may be formed on the gate insulating layer 140. The common voltage lines 151 may carry a common voltage Vcom and may be parallel to the gate lines 121 (i.e., extend in the transverse direction). At least a portion of each of the semiconductor islands 154 may be covered by the gate electrode 124. The common voltage line 151 and the semiconductor islands 154 may be made of any suitable material including, but not limited to, a transparent metal oxide semiconductor. The common voltage line 151 may have high conductivity.

A plurality of data lines 171, a plurality of source electrodes 173, and a plurality of drain electrodes 175 may be formed on the common voltage line 151, the semiconductor island 154, and/or the gate insulating layer 140. A passivation layer 180 may be formed on the data lines 171, the source electrodes 173, and the drain electrodes 175. The passivation layer 180 may have a plurality of contact holes 185a exposing an expansion 177 of the drain electrode 175, and a plurality of contact holes 185b exposing a portion of the common voltage line 151.

A plurality of pixel electrodes 191 and a plurality of common electrodes 199 may be formed on the passivation layer 180. The pixel electrodes 191 and the common electrodes 199 may be arranged alternately, and may be disposed in the same layer on the passivation layer 180.

The pixel electrodes 191 may include a longitudinal portion 195a extending in the longitudinal direction, an upper branch 193a obliquely extending in the left upper direction from the longitudinal portion 195a, a lower branch 194a obliquely extending in the left lower direction from the longitudinal portion 195a, and a lower protrusion 197a.

The common electrodes 199 may include a longitudinal portion 195b extending in the longitudinal direction, an upper branch 193b obliquely extending in the right lower direction from the longitudinal portion 195b, a lower branch 194b obliquely extending in the right upper direction from the longitudinal portion 195b, and a protrusion 197b protruding from the center of the longitudinal portion 192b to the right side.

The branches 193a and 194a of the pixel electrode 191 and the branches 193b and 194b of the common electrode 199 face each other and may be alternately disposed. The upper branches 193a and 193b may be inclined in the right lower direction thereby forming a first sub-region, and the lower branches 194a and 194b may be inclined in the right upper direction thereby forming a second sub-region.

An alignment layer 11 may be formed on the passivation layer 180, the pixel electrode 191, and the common electrode 199.

Next, referring to the upper panel 200, a light blocking member 220 having an opening 225 and a plurality of color filters 230 may be formed on the substrate 210. An overcoat 250 and an alignment layer 21 may be formed on the light blocking member 220 and the color filters 230. The color filters 230 may filter particular frequencies or colors. For example, the color filters 230 may be red filters, blue filters, or green filters or any combination thereof.

The two alignment layers 11 and 21 may be horizontal alignment layers.

The liquid crystal layer 3 that is disposed between the lower display panel 100 and the upper display panel 200 may include liquid crystal molecules 31 that have positive dielectric anisotropicity, and the liquid crystal molecules 31 may be aligned so that long axes thereof are parallel to the surfaces of the two display panels 100 and 200 in a state in which there is no electric field.

Data voltage may be applied to the pixel electrode 191 from the drain electrode 175 through the contact hole 185a at the protrusion 197a. Common voltage Vcom may be applied to the common electrode 199 from the common voltage line 151 through the contact hole 185b at the protrusion 197b.

When data voltage is applied to the pixel electrode 191 and common voltage Vcom is applied to the common electrode 199, an electric field almost parallel to the display panels 100 and 200 is generated in the liquid crystal layer 3. A horizontal component of the electric field may be perpendicular to the branches 193a, 193b, 194a, and 194b of the pixel electrode 191 and the common electrode 199. In response to the electric field, the long axes of the liquid crystal molecules 31 may rotate in a direction parallel to the electric field. Accordingly, the liquid crystal layer 3 on the first and second sub-regions may be divided into two domains having different rotation directions of the liquid crystal molecules 31. Therefore, a wide viewing angle may be obtained and lateral visibility may be improved.

Light transmittance through the liquid crystal layer 3 may be affected and changed due to the polarization of light passing through the liquid crystal layer 3 according to the direction of the liquid crystal molecules 31.

According to exemplary embodiments, the common voltage line 151 may be formed with the transparent oxide semiconductor of IGZO along with the semiconductor island 154 such that the aperture ratio of the display device may be increased, and the common voltage line 151 may have high conductivity such that the common voltage Vcom may be uniformly transmitted to the entire lower panel 100.

In the above-described exemplary embodiments, the LCD is described as an example, however exemplary embodiments of the present invention are not limited to the liquid crystal display and may be applied to several display devices of various structures that include signal lines transmitting a predetermined voltage such as the common voltage to a plurality of pixel areas. For example, in various display devices, signal lines transmitting the common voltage to several pixel areas may be formed using a transparent metal oxide semiconductor along with the semiconductor forming the thin film transistor, and a corresponding signal line may be irradiated by high frequency radiation/light such as ultraviolet rays to have high conductivity. Accordingly, an aperture ratio of the display device may be increased and the voltage such as the common voltage may be uniformly transmitted to the entire display panel such that the display quality of the display device may be increased. It should also be appreciated that the display device described hereinabove according to exemplary embodiments of the invention may be used in various electronic devices including, but not limited to, televisions, portable and non-portable devices, mobile phones, watches, navigation devices, display screens, laptops, and other computing and display devices.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
a substrate;
an insulation layer disposed on the substrate;
a first line directly disposed on a surface of the insulation layer, the first line comprising a transparent metal oxide semiconductor; and
a first semiconductor, different than the first line, directly disposed on the surface of the insulation layer, the first semiconductor comprising the transparent metal oxide semiconductor.

2. The display device of claim 1, wherein the first line comprises a common voltage line.

3. The display device of claim 2, further comprising:
a gate line comprising a gate electrode disposed between the substrate and the first semiconductor,
wherein the gate electrode is opaque.

4. The display device of claim 3, wherein the first semiconductor is disposed over the gate electrode.

5. The display device of claim 4, further comprising:
a thin film transistor comprising the gate electrode, the first semiconductor, a source electrode partially overlapping the first semiconductor, and a drain electrode.

6. The display device of claim 5, further comprising:
a pixel electrode and a common electrode disposed on the substrate,
wherein:
one of the pixel electrode and the common electrode comprises a plurality of branch electrodes;
the drain electrode is connected to the pixel electrode; and
the common electrode is connected to the first line.

7. The display device of claim 5, further comprising:
a pixel electrode disposed on the substrate and connected to the thin film transistor,
wherein the pixel electrode overlaps the first line with an insulating layer disposed between the pixel electrode and the first line to form a storage capacitor.

8. The display device of claim 1, further comprising:
a gate line comprising a gate electrode disposed between the substrate and the first semiconductor,
wherein the gate electrode is opaque.

9. The display device of claim 8, wherein the first semiconductor is disposed over the gate electrode.

10. The display device of claim 8, further comprising:
a thin film transistor comprising the gate electrode, the first semiconductor, a source electrode partially overlapping the first semiconductor, and a drain electrode.

11. The display device of claim 10, further comprising:
a pixel electrode and a common electrode disposed on the substrate,
wherein:
one of the pixel electrode and the common electrode comprises a plurality of branch electrodes;
the drain electrode is connected to the pixel electrode; and
the common electrode is connected to the first line.

12. The display device of claim 10, further comprising:
a pixel electrode disposed on the substrate and connected to the thin film transistor,
wherein the pixel electrode overlaps the first line via an insulating layer to form a storage capacitor.

13. The display device of claim 1, wherein any metal layer that is opaque is not formed on the first line.

14. The display device of claim 1, wherein the transparent metal oxide semiconductor of the first line is made of the same material as the transparent metal oxide semiconductor of the first semiconductor.

15. The display device of claim 1, wherein the transparent metal oxide semiconductor of the first line and the transparent metal oxide semiconductor of the first semiconductor comprise indium zinc gallium oxide (IZGO).

16. The display device of claim 1, wherein the first line and the first semiconductor are disposed on the same layer.

17. The display device of claim 1, wherein the transparent metal oxide semiconductor of the first line comprises a ultraviolet ray irradiated transparent metal oxide semiconductor.

18. The display device of claim 6, wherein, when the common electrode comprises the plurality of branch electrodes, the plurality of branch electrodes is inclined at an oblique angle with respect to a data line.

19. The display device of claim 14, wherein a width of the plurality of branch electrodes extending according to the data line and overlapping the data line is larger than a width of the plurality of branch electrodes not overlapping the data line.

20. The display device of claim 14, wherein the data line is curved at a center portion of a pixel area in which the data line is disposed.

* * * * *